United States Patent
Sindzingre et al.

[11] Patent Number: 5,433,820
[45] Date of Patent: Jul. 18, 1995

[54] METHOD AND APPARATUS FOR DRY PROCESS FLUXING

[75] Inventors: Thierry Sindzingre, Cachan; Sylvie Mellul, L'Hay Les Roses; Eric Duchateau, Versailles, all of France

[73] Assignee: L'Air Liquide, Societe Anonyme Pour l'Etude et l'Exploitation des Procedes Georges Claude, Paris, France

[21] Appl. No.: 136,278

[22] Filed: Oct. 15, 1993

[30] Foreign Application Priority Data

Oct. 30, 1992 [FR] France .................. 9213028

[51] Int. Cl.⁶ .......... H05H 1/00; C23G 5/00
[52] U.S. Cl. .................. 216/13; 156/345; 134/1; 134/2; 427/310; 427/328; 216/67; 216/76
[58] Field of Search ........... 156/643, 646, 664, 667, 156/665, 666, 345; 118/723 E; 134/1, 2; 422/186.05; 427/307, 309, 327, 328, 310

[56] References Cited

U.S. PATENT DOCUMENTS

| | | |
|---|---|---|
| 4,436,761 | 3/1984 | Hayashi et al. ............ 437/225 X |
| 4,983,255 | 1/1991 | Gruenwald et al. ............ 156/643 |
| 5,000,819 | 3/1991 | Pedder et al. ............ 156/646 X |
| 5,041,304 | 8/1991 | Kusano et al. ............ 427/535 |
| 5,185,132 | 2/1993 | Horiike et al. ............ 422/186.05 |
| 5,193,739 | 3/1993 | Liedke et al. ............ 134/31 X |
| 5,225,659 | 7/1993 | Kusano et al. ............ 219/121.52 |
| 5,286,532 | 2/1994 | Yoshikawa et al. ............ 427/536 |

FOREIGN PATENT DOCUMENTS

| | | |
|---|---|---|
| 0371693 | 6/1990 | European Pat. Off. . |
| 0427020 | 5/1991 | European Pat. Off. . |
| 0518774 | 12/1992 | European Pat. Off. . |
| 2072430 | 9/1981 | United Kingdom . |

*Primary Examiner*—Thi Dang
*Attorney, Agent, or Firm*—Young & Thompson

[57] ABSTRACT

In a method of dry process fluxing at least one surface of a metallic article, the surface to be fluxed is treated with a plasma at atmospheric pressure of a gaseous mixture comprising hydrogen and optionally at least one inert gas. The invention also concerns an apparatus, particularly for practicing the process, as well as a process for soldering or plating.

21 Claims, 2 Drawing Sheets

METHOD AND APPARATUS FOR DRY PROCESS FLUXING

FIELD OF THE INVENTION

The present invention concerns a method and apparatus for dry process fluxing of at least one surface of a metallic article, particularly in view of soldering or plating thereof.

BACKGROUND OF THE INVENTION

Soldering of metallic articles, particularly soldering of electronic components to the surface of a metallic support, such as a printed circuitboard, is normally performed in industry according to two principal methods: wave soldering and reflow soldering.

The wave soldering method may also be used to plate metallic articles, particularly the metallic parts of electronic components.

To solder or plate a metallic article by the wave soldering method, the metallic parts of the said article that are to be wetted by the solder are generally fluxed by means of a flux. This latter is constituted of organic compounds, particularly organic acids and halogenated derivatives.

The fluxing has as an essential object to clean the metallic surfaces, principally to eliminate therefrom metallic oxides, so as to facilitate and improve the quality of their wetting by the solder.

After passage on the solder wave, flux residues remain on the treated metallic surfaces. These flux residues are corrosive and conductive, and must therefore be eliminated by a cleaning operation normally using halogenated solvents, in particular chlorofluorocarbons (CFC).

Reflow soldering consists of depositing a solder paste on localized receiving regions at the surface of a support, contacting metallic articles such as electronic components with the soldering paste, then heating the reflow solder paste, particularly by means of infrared radiation, by convection, in vapor phase, by a combination of infrared radiation and convection, for example in a reflow furnace.

The solder paste comprises a metal alloy powder dispersed in an organic medium comprising a flux. This flux is itself also conventionally constituted by organic acids and halogenated derivatives, and has the same function of cleaning metallic surfaces.

After heating the solder paste, here again flux residues persist on the surface of the support, which give rise to the same disadvantages as described above. As in the case of wave soldering, it requires eliminating these residues by a cleaning operation, generally using CFCs.

THE KNOWN PRIOR ART

In the context of the Montreal protocol seeking to eliminate production of CFCs, various solutions have been contemplated to suppress their use in the cleaning of flux residues, both in the case of wave soldering as well as for reflow solder.

Among these solutions, there can be mentioned the so-called "no-cleaning" method, which consists of using "low residue" fluxes whose formulations are modified so as to minimize the quantity of flux residue. But it has been ascertained that non-negligible quantities of flux residue remain present on the surfaces of the treated metallic articles.

Consequently, other methods have also been proposed, called "dry process fluxing", which involve treating the surfaces to be fluxed with a gaseous phase. The gaseous phase reacts at the level of the treated surfaces particularly so as to form volatile reaction products which are eliminated by the further action of the gaseous phase.

Thus, M. W. Liebfried proposed to the European ISHM Commerce at Hamburg (1989), a dry process fluxing, using a gaseous phase consisting of a mixture of nitrogen and formic acid, produced by causing nitrogen to bubble in a reservoir of formic acid. Nevertheless, formic acid, under operating conditions, has significant safety problems.

European patent application 371,693 describes a soldering process also using dry process fluxing. According to this process, a sample to be treated is placed on a substrate heater platform maintained at a sufficient temperature to melt a solder, the sample and the substrate platform being disposed in a low pressure reactor.

A very low pressure is caused to prevail in the reactor, on the order to $10^{-5}$ Torr ($133 \times 10^5$ Pa). This low pressure is produced by a diffusion pump and a primary pump. Next, an atmosphere consisting of hydrogen and argon is introduced into the reactor at a pressure of 10 to 100 mTorr (1.330 to 13.30 Pa), from which a plasma is formed by means of microwave energy, this plasma permitting elimination of metallic oxides. This process has the major disadvantage of requiring an installation for producing a secondary vacuum, which makes it very difficult to use on an industrial scale. Moreover, at low pressure, heat transfers by radiation are generally preponderant, so that furnaces such as hot wall furnaces could not properly be used and would need to be replaced by more closely radiant systems.

SUMMARY OF THE INVENTION

The present invention thus concerns a method and apparatus overcoming the disadvantages described above in methods of dry process fluxing, and in particular, which do not require establishment of a high vacuum and create safety problems.

The invention comprises a method of dry process fluxing of at least one surface of a metallic article, characterized in that the surface to be fluxed is treated with a plasma at atmospheric pressure of a gaseous mixture comprising hydrogen and optionally at least one inert gas. Such a plasma contains atomic hydrogen.

It has surprisingly been discovered that the method of dry process fluxing of the invention, using a plasma containing atomic hydrogen at atmospheric pressure, may be used for, in particular, eliminating metallic oxides present on the treated surfaces, in a manner at least as effective as when a very low pressure plasma is used. Such a process may therefore be easily performed on an industrial scale.

The said constituent inert gas of the plasma may be nitrogen, helium, or, preferably, argon.

The hydrogen concentration in the gaseous mixture may be comprised between 0.01% and 100% by volume, preferably between 0.5 and 50% by volume.

The surface to be fluxed may be treated with the plasma at a temperature less than 300° C., preferably comprised between ambient and 200° C., more preferably between 110° C. and 180° C.

Within the scope of the method of the invention, the plasma may be created by exciting, at atmospheric pressure, a gaseous mixture containing hydrogen and optionally at least one inert gas, by microwaves produced by a microwave generator. This microwave plasma may have the appearance of a luminescent discharge.

The plasma may also be created by exciting, at atmospheric pressure, a gaseous mixture containing hydrogen and if desired at least one inert gas, by a dielectric barrier electric discharge.

The dielectric barrier electric discharge involves producing an electric discharge between two electrodes, at least one of which is covered by a dielectric material, such as glass, alumina, silica, or a polymer. Such a discharge may particularly consist of a luminescent discharge or "silent glow" discharge, or, preferably, in the scope of the invention, of a corona discharge.

The corona discharge is a conventional discharge well known per se, cf. the article "Traitement par effet corona, considerations techniques sur l'equipement" by S. Tuffin from "Plastiques Modernes et Elastomers", May 1977, pp. 54–56, which indicates materials to be used and operating conditions.

A corona discharge is produced between two electrodes whose radii of curvature differ greatly. By way of example, one electrode may be in the shape of a cylinder, the other being planar. In the context of the invention, one of the two electrodes may be constituted by the said metallic article itself. A high voltage may be applied between the electrodes. This high voltage may be comprised between 1 and 50 kV, with a frequency comprised between continuous and 100 kHz.

According to one aspect of the invention, the surface of the metallic article may be covered by a layer of the said dielectric material, in which a hole is formed exposing a portion of the surface of the metallic article to be treated.

This hole may be formed such that it is situated facing one of the electrodes. But preferably, to obtain a more stable corona discharge, the hole in the layer of dielectric material is formed laterally at a distance for example from 1 to 5 cm, from the position facing the electrode, described above.

In this manner, the corona discharge propagates to the surface of the dielectric material, up to the hole, where it encounters the surface of the metallic article to be fluxed. There is thus obtained a so-called "transferred" corona discharge, which is particularly stable.

The invention also concerns apparatus that is particularly adapted for practicing the method described above.

BRIEF DESCRIPTION OF THE DRAWINGS

These and other features and advantages of the present invention will become apparent from a consideration of the following description, taken in connection with the accompanying drawings, in which.

DETAILED DESCRIPTION OF THE PREFERRED EMBODIMENTS

Figure 1:
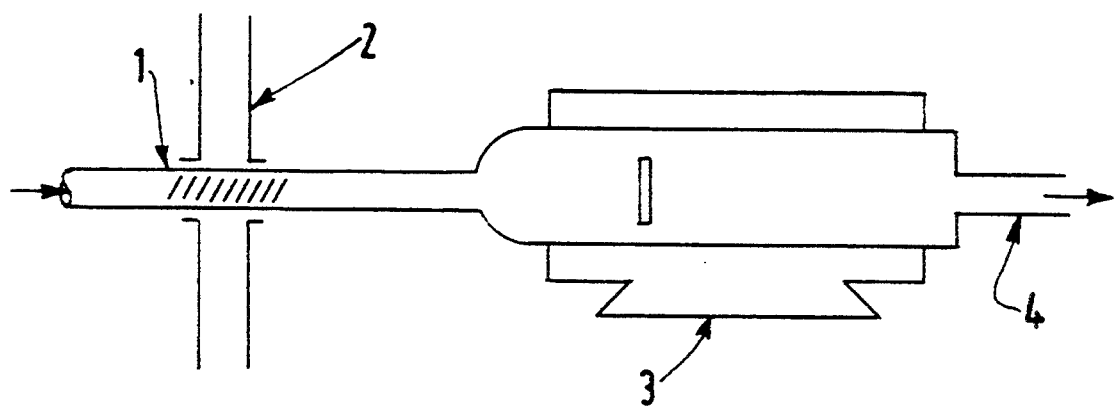
FIG. 1 is a cross-sectional view of apparatus for practicing a method according to the present invention.

FIG. 1 shows a sectional view of an apparatus for fluxing a metallic article by means of a microwave plasma. This apparatus comprises a gas supply tube 1.

The supply tube 1 may be of a dielectric material, typically quartz. The supply tube 1 traverses a wave guide 2, disposed perpendicular to the said supply tube. The wave guide 2 is connected to a microwave generator (not shown). The supply tube 1 opens into a furnace 3, for example an Adamel furnace, provided with an extraction tube 4.

In operation, a metallic article to be fluxed is placed in the furnace 3 and a gaseous mixture containing hydrogen and optionally at least one inert gas is continuously introduced therein through the supply tube 1, at a predetermined rate of flow. The plasma is generated in the supply tube 1, at the level of the intersection zone with the wave guide 2. Thereafter, the constituent species of the plasma, notably atomic hydrogen, diffuse into the furnace, so as to flux the metallic article.

Figure 2:
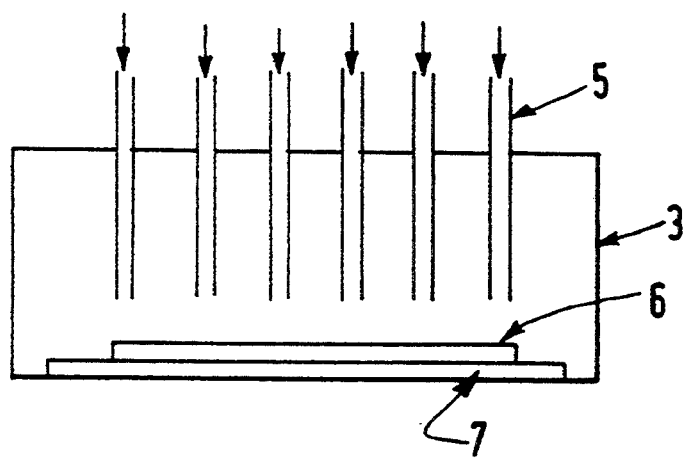
FIG. 2 is a view similar to FIG. 1 but showing another embodiment thereof.

FIG. 2 shows a section of another apparatus for dry process fluxing by means of a microwave plasma, at atmospheric pressure.

This apparatus is a variant of that shown in FIG. 1, but is more particularly adapted for application on an industrial scale. This apparatus comprises a furnace 3 into which open a row of gas supply tubes 5, provided with wave guides (not shown).

The portion of the supply tubes shown in FIG. 2 is that which follows the intersection zone with the wave guides. The treated metallic article, for example a metallic plate 6, is conveyed into the furnace by means of a conveyor belt 7.

The operation of this apparatus is similar to that shown in FIG. 1. It permits treating metallic articles of various shapes and sizes.

If a row of supply tubes 5, provided with wave guides, is insufficient to perform the desired treatment, several of these rows may be associated in series.

Figure 3:
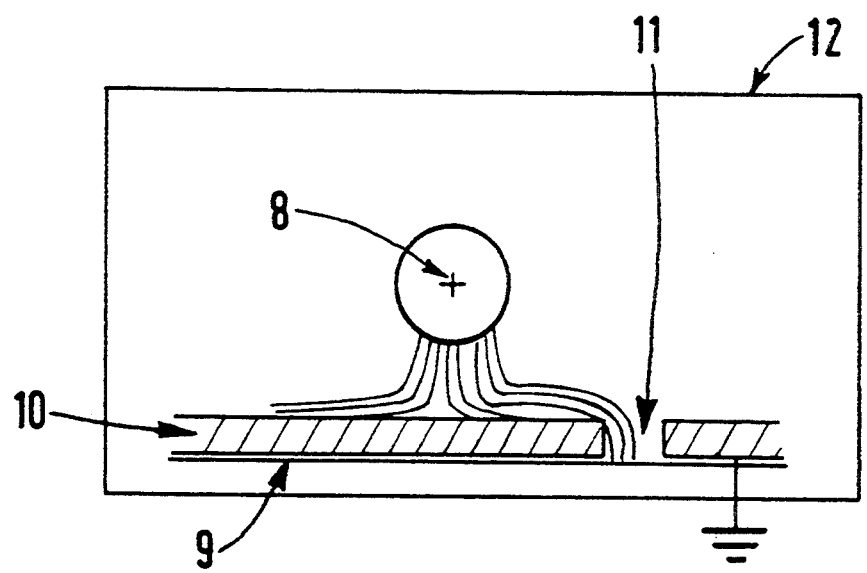
FIG. 3 is a view similar to FIGS. 1 and 2 but showing a third embodiment thereof.

FIG. 3 shows a section of an apparatus for fluxing a metallic article by means of a plasma created by a transferred corona discharge.

This device comprises, in a chamber 12 provided with a gas supply tube (not shown), a high voltage electrode E that is cylindrical in shape and a second electrode 9, in this case consisting of a grounded metallic plate. This metallic plate is in this case the metallic article to be treated. A layer of a dielectric material 10 is disposed above the electrode 9. The said layer has a hole 11 disposed laterally at a distance from the electrode 8. This hole exposes part of the surface of the metallic article to be fluxed.

This apparatus functions in the following manner: a voltage is applied between the electrodes 8 and 9 so as to create a transferred corona discharge, which spreads out on the surface of the layer of dielectric material, and thereafter on the portion of the electrode surface 9 exposed by the hole 11. Parallelly, a gaseous mixture containing hydrogen and optionally at least one inert gas is introduced into the chamber 12 by means of a supply tube. This gaseous mixture is excited by the corona discharge and forms a plasma containing atomic hydrogen. This plasma will flux that portion of the metallic article forming electrode 9, which is exposed by the hole 11.

Figure 4:
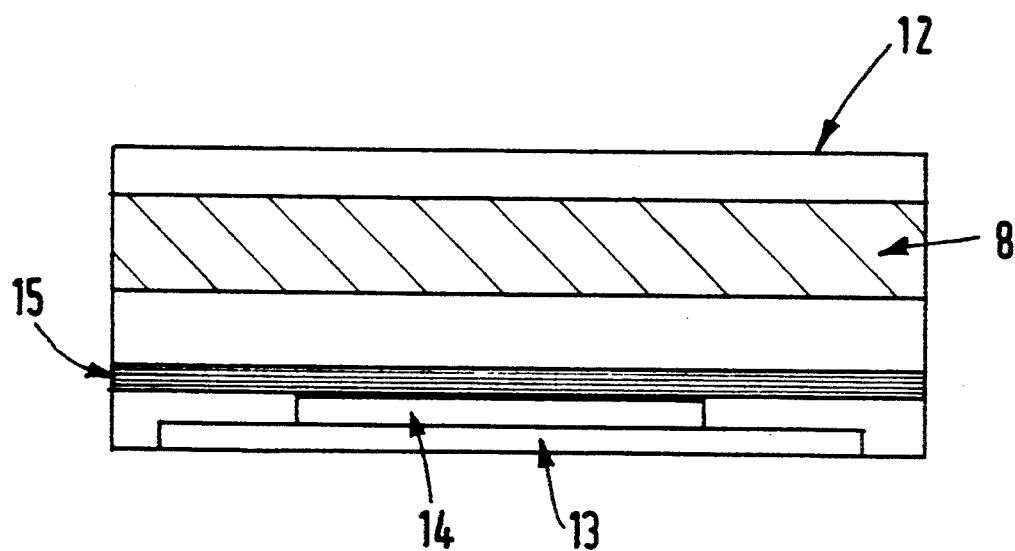
FIG. 4 is a view similar to FIGS. 1-3 but showing a fourth embodiment thereof.

FIG. 4 shows a section of a device for dry process fluxing, at atmospheric pressure. This apparatus is a variation of that shown in FIG. 3, but is more particularly adapted for industrial application.

This device comprises a chamber 12 such as a furnace, in which is disposed a high voltage electrode 8, for example of cylindrical shape, disposed above a conveyor belt 13 forming an electrode. The metallic article 14 to be treated is disposed on the conveyor belt 13. A layer of dielectric material 15, fixed in the chamber, is disposed above the conveyor belt 13 at a distance sufficient to permit passage of the metallic article 14. In this layer 15, a hole (not shown) has been formed laterally at a distance from the high voltage electrode 8. The length of the hole may be equal to that of the electrode 8. The manner of operation of this apparatus is similar to that of the apparatus of FIG. 3.

As the metallic article to be treated is drawn beneath the hole over all its length, by the conveyor belt, it is possible to flux a greater surface. It is also possible to mount in parallel several high voltage electrodes 8 in the chamber 12 and to form as many holes in the layer 15 of dielectric material, each of these holes being situated laterally at a distance from the electrode to which it corresponds.

The invention also concerns a process for soldering or plating at least one surface of a metallic article according to which, prior to the soldering or plating operation, the said surface is fluxed according to the process described above. During the soldering or plating operation, the said article may be maintained at a temperature less than or equal to 200° C., generally at a temperature comprised between 180° C. and 200° C.

The soldering or plating operation may be performed conventionally according to the wave soldering technique.

The soldering operation may also be performed conventionally by reflow. In this latter case, the solder paste utilized may, in a known manner, comprise a powder of a metallic alloy, such as lead-tin, lead-tin-silver, or lead-indium alloys, dispersed in an organic medium. This latter may comprise at least one organic solvent, at least one thickening agent and/or at least one resin, such as a colophonic resin. Moreover, the organic medium may comprise a flux based on fluxing activators, generally organic compounds such as organic acids and/or halogenated derivatives. Nevertheless, to the extent that at least one of the surfaces of the metallic article to be soldered has been fluxed according to the process described above, the flux concentration of the said organic medium may be significantly decreased, so as to minimize flux residues remaining on the said surface after soldering. Still more advantageously, the organic medium constituting the solder paste may be totally free of flux.

The fluxing processes and, if necessary, the soldering or plating processes according to the invention, are more particularly intended for treatment of metallic articles constituting all or part of electronic components such as transistors, resistors, capacitors, integrated circuits or supports for such electronic components, such as printed circuitboards.

The following examples are intended to illustrate the present invention.

EXAMPLE 1

An apparatus such as that shown in FIG. 1 is used, to flux the surfaces of a surface-oxidized copper plate, whose dimensions are 20 mm×20 mm×1 mm.

The supply tube 1 of quartz has a diameter of 4 mm at the level of the wave guide. The diameter of the tube 1 enlarges to 5 cm before entering the furnace 3 and extends over the entire length of the furnace to form a chamber in which the oxidized copper plate is positioned. The furnace 3 is an Adamel furnace having a cylindrical ceramic sleeve surrounding the said chamber.

A gaseous mixture consisting of 97% by volume argon and 3% by volume hydrogen is introduced into the tube 5 at a flow rate of 10 l/minute. From this gaseous mixture, a plasma is created containing atomic hydrogen by means of microwaves propagated by the wave guide 2. The power injected into the plasma is 200 W. The copper plate is heated to 150° C.

The surfaces of the copper plate may thus be reduced in less than two minutes.

EXAMPLE 2

An apparatus such as that shown in FIG. 3 is used to flux a surface-oxidized copper plate. This copper plate forms the electrode 9. It is covered with a layer of dielectric silicon, in which a hole of 1 cm$^2$ has been formed, exposing a 1 cm$^2$ surface of the copper plate. This hole is disposed at a distance of 1 cm from the region facing the high voltage electrode 8.

A voltage of 20 kV is applied between the electrodes, with a frequency of 15 kHz. Then, to create a transferred corona discharge, there is introduced into the chamber 12 a gaseous mixture consisting of 98% by volume argon and 2% by volume hydrogen, at a flow rate of 4 l/minute.

The excitation of the gaseous mixture permits creating a plasma containing atomic hydrogen promoting a reduction, at the ambient temperature, of the surface of the plate to be treated exposed by the hole 11.

What is claimed is:

1. Method of dry fluxing at least one surface of a metallic article, comprising the following steps:
   a) forming a plasma through a transferred corona discharge created between a first electrode and a second electrode, by:
   disposing between said first electrode and said second electrode, a layer of dielectric material having at least one hole disposed laterally at a distance from said first electrode;
   introducing, at atmospheric pressure, a gaseous mixture comprising hydrogen in the space between said first electrode and said second electrode, and
   b) treating the surface to be fluxed with said plasma.

2. Method according to claim 1, wherein the gaseous mixture further comprises at least one inert gas.

3. Method according to claim 2, wherein the inert gas is nitrogen or helium.

4. Method according to claim 2, wherein the inert gas is argon.

5. Method according to claim 1, wherein the hydrogen concentration of said gaseous mixture is comprised between 0.5% to 50% by volume.

6. Method according to claim 1, wherein said second electrode is a conveyor belt conveying said article.

7. Method according to claim 1, wherein said second electrode is the metallic article to be treated by said plasma.

8. Method according to claim 6, wherein said layer of dielectric material is fixed.

9. Method of soldering or plating at least one surface of a metallic article, comprising, prior to performing a soldering or plating operation, the fluxing of the surface according to the method of claim 1.

10. Method according to claim 9, wherein the soldering or plating operation is performed according to a wave soldering technique.

11. Method according to claim 9, wherein the soldering operation is performed by reflow soldering.

12. Method according to claim 9, wherein the metallic article is maintained at a temperature no higher than 200° C. during the soldering or plating operation.

13. Method according to claim 12, wherein the metallic article is maintained at a temperature no higher than 1800° C. during the soldering or plating operation.

14. Method according to claim 1, wherein the surface to be fluxed is treated at a temperature lower than 300° C.

15. Method according to claim 14, wherein the surface to be fluxed is treated at a temperature comprised between ambient temperature and 200° C.

16. Method according to claim 1, wherein the metallic article is an electronic component or a support for electronic components.

17. Apparatus for generating a transferred corona discharge, comprising a chamber (12) provided with a gas supply tube, at least one first electrode (8) and a second electrode (9, 13), a layer of dielectric material (10, 15) being disposed between said first electrode (8) and said second electrode (9, 13), and having at least one hole (11) disposed laterally at a distance from said first electrode (8).

18. Apparatus according to claim 17, wherein said second electrode is a conveyor belt (13).

19. Apparatus according to claim 17, wherein the said second electrode is a metallic article to be treated in the chamber.

20. Apparatus according to claim 17, wherein the layer of dielectric material (15) is fixed in the chamber.

21. Apparatus for generating a transferred corona discharge, comprising:
a chamber (12) provided with a gas supply tube;
at least one first electrode (8);
a second electrode constituted by a conveyor belt (13) for circulating electronic circuits having metallic regions to be fluxed on which electronic components will be soldered;
a layer of a dielectric material (15), fixed in the chamber, disposed between said first electrode and said second electrode, above the conveyor belt at a sufficient distance to permit passage of the electronic circuits, in which layer has been formed at least one hole (11) disposed laterally at a distance from said first electrode (8), said hole permitting fluxing of at least one of the metallic regions of each of the said circuits.

* * * * *